(12) United States Patent
Kapoor

(10) Patent No.: US 7,531,854 B2
(45) Date of Patent: May 12, 2009

(54) SEMICONDUCTOR DEVICE HAVING STRAIN-INDUCING SUBSTRATE AND FABRICATION METHODS THEREOF

(75) Inventor: Ashok K. Kapoor, Palo Alto, CA (US)

(73) Assignee: DSM Solutions, Inc., Los Gatos, CA (US)

( * ) Notice: Subject to any disclaimer, the term of this patent is extended or adjusted under 35 U.S.C. 154(b) by 0 days.

(21) Appl. No.: 11/744,660

(22) Filed: May 4, 2007

(65) Prior Publication Data
US 2008/0272393 A1 Nov. 6, 2008

(51) Int. Cl.
H01L 29/76 (2006.01)
H01L 29/94 (2006.01)
H01L 31/00 (2006.01)
(52) U.S. Cl. ............... 257/279; 257/285; 257/E27.069
(58) Field of Classification Search ................ 257/279, 257/285, E27.069
See application file for complete search history.

(56) References Cited

U.S. PATENT DOCUMENTS

| | | | | |
|---|---|---|---|---|
| 5,714,777 | A | 2/1998 | Ismail et al. | 257/263 |
| 6,059,895 | A * | 5/2000 | Chu et al. | 148/33.1 |
| 6,251,738 | B1 | 6/2001 | Huang | 438/312 |
| 7,329,909 | B2 * | 2/2008 | Saito et al. | 257/192 |
| 2002/0017642 | A1 | 2/2002 | Mizushima et al. | 257/19 |
| 2004/0178406 | A1 | 9/2004 | Chu | 257/19 |
| 2004/0227154 | A1 | 11/2004 | Chu et al. | 257/194 |
| 2006/0054929 | A1 * | 3/2006 | Nakayama et al. | 257/197 |
| 2006/0134893 | A1 | 6/2006 | Savage et al. | 438/483 |
| 2006/0163581 | A1 | 7/2006 | Suvkhanov | 257/65 |
| 2007/0096144 | A1 | 5/2007 | Kapoor | 257/13.4 |
| 2007/0170463 | A1 * | 7/2007 | Ueno et al. | 257/192 |
| 2007/0278521 | A1 * | 12/2007 | Ishida et al. | 257/192 |
| 2008/0001183 | A1 * | 1/2008 | Kapoor | 257/256 |

OTHER PUBLICATIONS

Patent Pending U.S. Appl. No. 12/178,291 entitled *Semiconductor Device Having Strain-Inducing Substrate and Fabrication Methods Thereof* by Ashok K. Kapoor.
Matthew T. Currie, *2004 International Conference on Integrated Circuit Design and Technology*, IEEE, 2004 "Strained Silicon: Engineered Substrates and Device Integration," pp. 261-268.
*Dielectric and semiconductor materials, devices, and processing—ecs transactions—SiGe and Ge: Materials, Processing, and Devices*, ECS Transactions, vol. 3, No. 7, "Strained Si/SiGe Heterostructures on Insulator," 2006, pp. 9-11.

(Continued)

*Primary Examiner*—Ngan Ngo
(74) *Attorney, Agent, or Firm*—Baker Botts L.L.P.

(57) ABSTRACT

A semiconductor device includes a semiconductor substrate that includes a substrate layer having a first composition of semiconductor material. A source region, drain region, and a channel region are formed in the substrate, with the drain region spaced apart from the source region and the gate region abutting the channel region. The channel region includes a channel layer having a second composition of semiconductor material. Additionally, the substrate layer abuts the channel layer and applies a stress to the channel region along a boundary between the substrate layer and the channel layer.

14 Claims, 13 Drawing Sheets

OTHER PUBLICATIONS

PCT Notification of Transmittal of the International Search Report and the Written Opinion of the International Searching Authority, or the Declaration with attached International Search Report and Written Opinion of the International Searching Authority in International Application No. PCT/US2008/061198 dated Aug. 6, 2008, 12 pages.

* cited by examiner

SEMICONDUCTOR DEVICE HAVING STRAIN-INDUCING SUBSTRATE AND FABRICATION METHODS THEREOF

TECHNICAL FIELD OF THE INVENTION

This invention relates, in general, to semiconductor devices and, more particularly, to devices fabricated from strained semiconductor material.

BACKGROUND OF THE INVENTION

As a result of the rapid technological growth of the past several decades, transistors and other semiconductor devices have become a fundamental building block for a wide range electronic components. Metal-oxide silicon field-effect transistors (MOSFET) have been the primary choice for transistors in many applications including general-use microprocessors, digital signal processors, application specific integrated circuits (ASICs) and various other forms of electronic devices. With the demand for electronic devices that are increasingly smaller and faster, the inclusion of the metal oxide layer from which MOSFETs derive their name creates significant limitations to further improvements in the size and operating speed of such devices. Consequently, the focus of industry development has begun to shift to junction field effect transistors (JFETs) and other types of semiconductor devices.

SUMMARY OF THE INVENTION

In accordance with the present invention, the disadvantages and problems associated with prior semiconductor devices have been substantially reduced or eliminated.

In accordance with one embodiment of the present invention, a semiconductor device includes a semiconductor substrate that includes a substrate layer having a first composition of semiconductor material. A source region, drain region, and a channel region are formed in the substrate, with the drain region spaced apart from the source region and the gate region abutting the channel region. The channel region includes a channel layer having a second composition of semiconductor material. Additionally, the substrate layer abuts the channel layer and applies a stress to the channel region along a boundary between the substrate layer and the channel layer.

In accordance with another embodiment of the present invention, a method for fabricating a semiconductor device includes forming a semiconductor substrate that comprises a substrate layer having a first composition of semiconductor material. The method also includes forming a source region, a drain region, a gate region, and a channel region in the substrate. The channel region is formed abutting the gate region and includes a channel layer having a second composition of semiconductor material. Additionally, the substrate layer abuts the channel layer and applies a stress to the channel region along a boundary between the substrate layer and the channel layer.

Technical advantages of certain embodiments of the present invention include providing a semiconductor device with increased operating speed and reduced power consumption. Other technical advantages of the present invention will be readily apparent to one skilled in the art from the following figures, descriptions, and claims. Additionally, while specific advantages have been enumerated above, various embodiments may include all, some, or none of the enumerated advantages. The following technical advantages may be achieved by some or all of the embodiments of the present invention.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF THE INVENTION

Figure 1A:
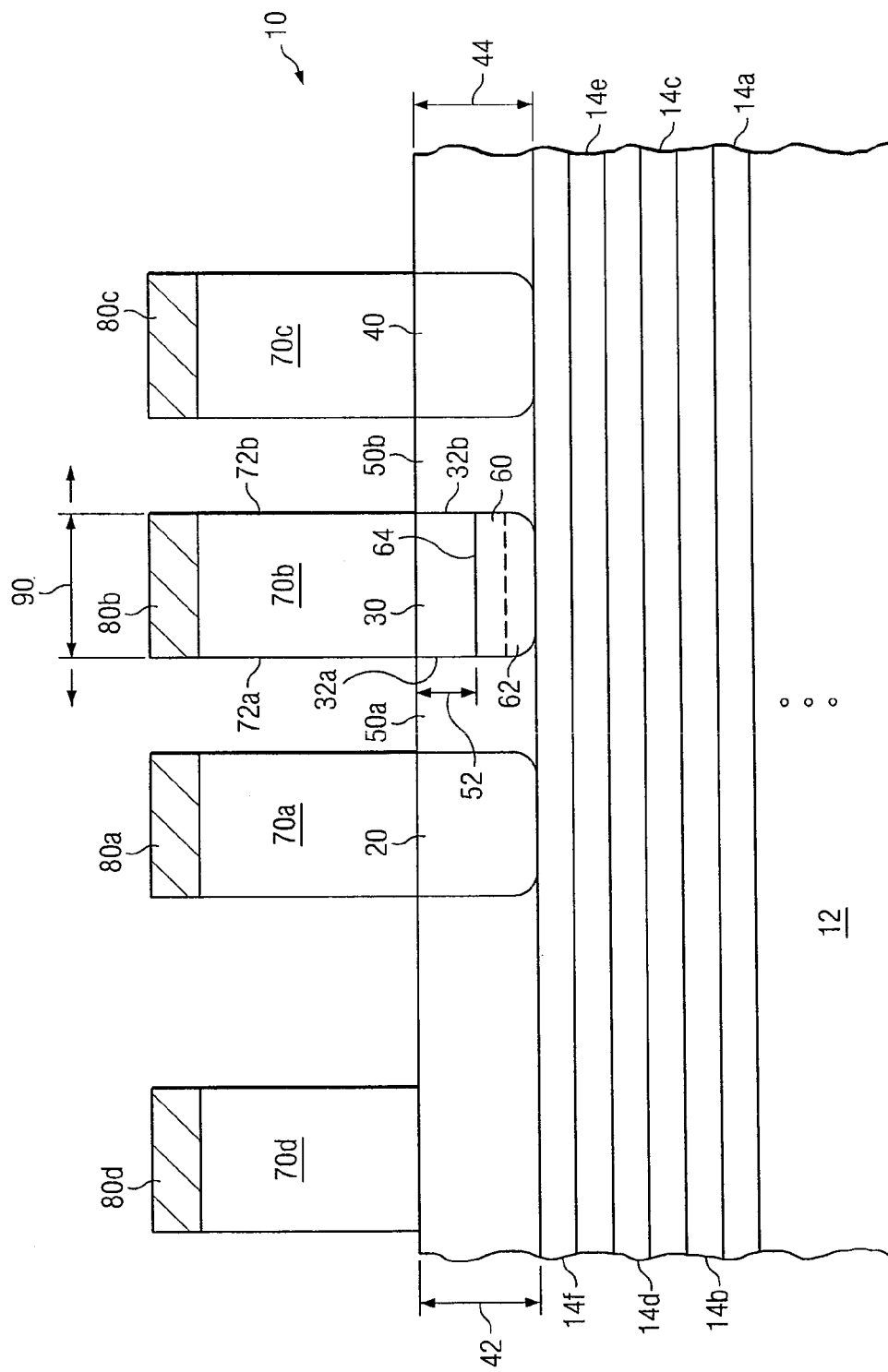
FIG. 1A illustrates a cross-sectional view of a semiconductor device according to a particular embodiment of the present invention.

FIG. 1A shows a cross-sectional view of a semiconductor device 10 according to a particular embodiment of the present invention. As shown in FIG. 1A, semiconductor device 10 includes a substrate 12, a source region 20, a gate region 30, a drain region 40, link regions 50a-b, a channel region 60, polysilicon regions 70a-d, and contacts 80a-d. In general, voltages applied to contacts 80a-d of semiconductor device 10 affect the conductivity of channel region 60 and, when appropriate voltages are applied to contacts 80a-d, a current flows between source region 20 and drain region 40 through channel region 60. While semiconductor device 10 may represent any appropriate form of electronic device that has the described structure and/or provides the described functionality, in particular embodiments, semiconductor device 10 represents a junction field-effect transistor (JFET).

Additionally, in particular embodiments, a stress may be applied to channel region 60, thereby straining the semiconductor material of which channel region 60 is comprised. In particular embodiments, the strain in channel region 60 may be created and/or applied to channel region 60 by layers of substrate 12 that abut channel region 60 and have a different composition of semiconductor material than that of channel region 60. In particular, differences in the interatomic spacing between the material of channel region 60 and that of the neighboring layers of substrate 12 may induce a strain in portions of channel region 60 abutting these substrate layers, as described further below. This strain may increase the mobility of charge carriers in channel region 60. The improvement in charge mobility may, in turn, allow semiconductor device 10 to switch states (e.g., turn on and turn off) more quickly and operate with lower power consumption.

Substrate 12 represents bulk semiconductor material to which dopants can be added to form various conductivity regions (e.g., source region 20, gate region 30, drain region 40, and channel region 60). Substrate 12 may be formed of any suitable semiconductor material or materials, such as materials from Group III and Group V of the periodic table. Substrate 12 may have a particular conductivity type, such as p-type or n-type. In particular embodiments, semiconductor device 10 may represent a portion of a substrate 12 that is shared by a plurality of different semiconductor devices (not illustrated). For example, in particular embodiments, a complementary pair of semiconductor devices 10 having differing polarities may share the same substrate 12 with a first semiconductor device 10 being formed in a well having a different polarity from the remainder of substrate 12.

Substrate 12 may be formed from one or more substrate layers (such as substrate layers 14a-f in FIG. 1A). In particular embodiments, the composition of these substrate layers 14, including the type of semiconductor material used in the various substrate layers 14 and their respective ratios, may vary among the different substrate layers 14. In particular embodiments, the semiconductor material used to form substrate layers 14 may represent various types of crystalline materials that form lattice structures. The atoms of these lattices may have a particular interatomic spacing (expressed in terms of the material's lattice constant) that varies based on the composition of the materials in a particular layer 14. More specifically, substrate layers 14 may be formed of alloys of a first semiconductor material and a second semiconductor material, with a gradually increasing percentage of the second semiconductor material in successive substrate layers 14. Depending on the characteristics of the semiconductor materials used, the spacing between atoms in the crystal lattice of the alloy may increase or decrease as the percentage of the second semiconductor material included in the alloy increases.

An additional layer of semiconductor material (referred to here as "channel layer 62'") may be formed in channel region 60 on top of these substrate layers 14. In particular embodiments, the substrate layer 14$f$ abutting channel layer 62 includes a different composition of semiconductor material from channel layer 62. Consequently, the spacing between atoms in substrate layer 14$f$ differs from the spacing between atoms in channel layer 62. As a result of this difference in spacing, the atoms of channel layer 62 adjust to align with atoms in the substrate layer 14$f$. Depending on the difference in interatomic spacing between channel layer 62 and substrate layer 14$f$, the movement of these atoms may produce a tensile or compressive strain in channel layer 62 and/or channel region 60 overall. An example of such a strain is shown in FIG. 1A by arrows 90.

Figure 1B:
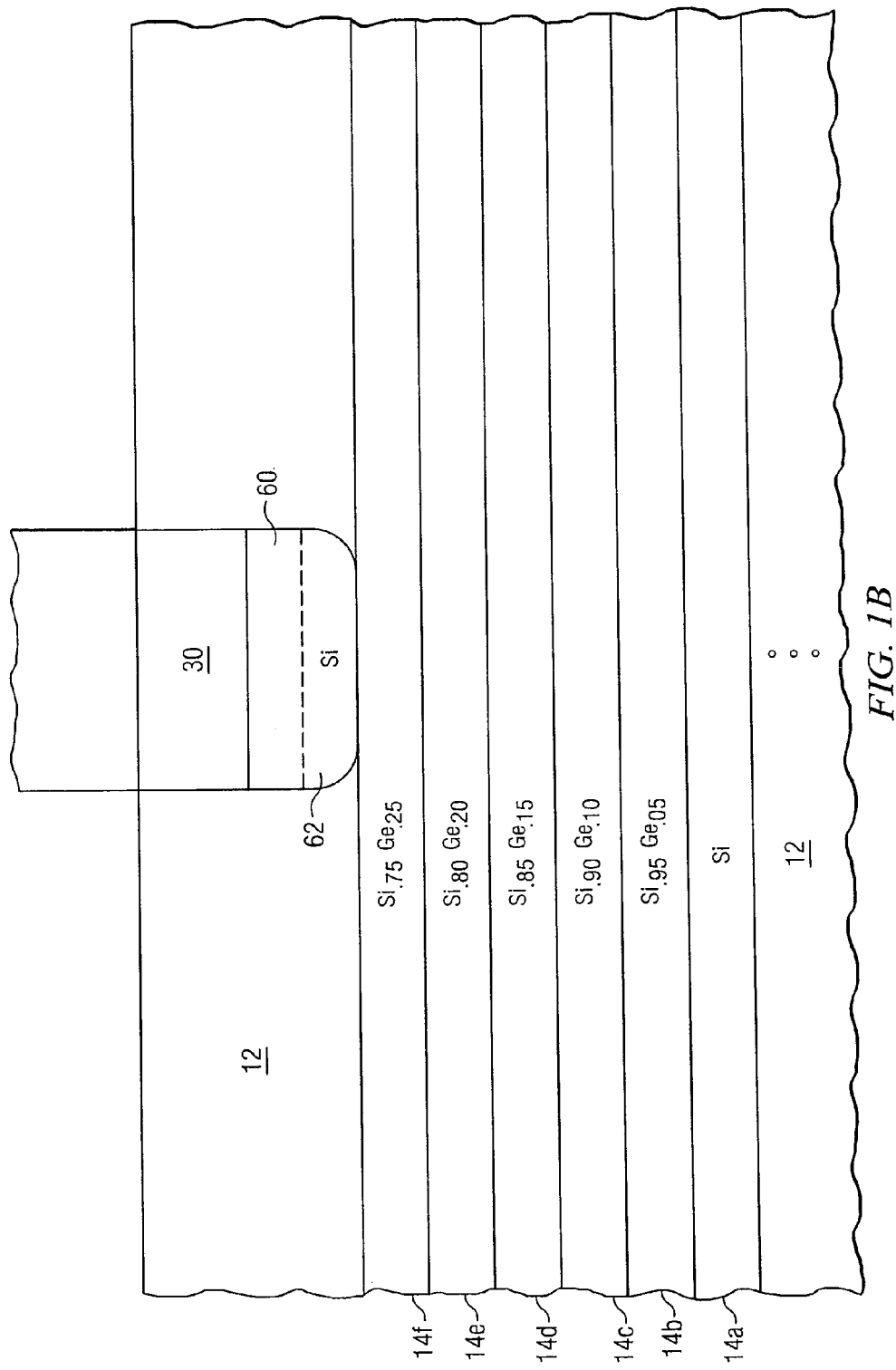
FIG. 1B illustrates a magnified view of a portion of the semiconductor device shown in FIG. 1A.

For example, in particular embodiments, substrate layers 14 may comprise successive layers of silicon germanium formed on a base layer of relaxed silicon. These substrate layers 14 may include an increasing amount of germanium. When channel layer 62 composed of silicon is formed on substrate layer 14$f$, the difference between the lattice constants of the silicon germanium in substrate layer 14$f$ and the silicon in channel layer 62 causes atoms in the silicon of channel layer 62 to align with atoms in the silicon germanium of substrate layer 14$f$. Because the lattice constant for the silicon germanium in substrate layer 14$f$ is greater than the lattice constant for the silicon in channel layer 62, the movement of these atoms produces a tensile strain in channel layer 62 and/or channel region 60 overall. In alternative embodiments, silicon germanium may be replaced by alloys having a smaller lattice constant than silicon such as, for example, silicon carbon. This may result in substrate layer 14$f$ producing a compressive strain in channel layer 62 and/or channel region 60. FIG. 1B illustrates in greater detail the composition of substrate layers 14 and channel region 62 in an example embodiment of semiconductor device 10.

Returning to FIG. 1A, source region 20 and drain region 40 each comprise regions of substrate 12 formed by the addition of a first type of dopant to substrate 12. For example, the first type of dopant may represent particles of n-type doping material such as antimony, arsenic, phosphorous, or any other appropriate n-type dopant. Alternatively, the first type of dopant may represent particles of p-type doping material such as boron, gallium, indium, or any other suitable p-type dopant. In particular, source region 20 and drain region 40 are doped with the same type of doping material as channel region 60. Thus, for an n-type channel semiconductor device 10, source region 20 and drain region 40 are doped with n-type impurities. For a p-type semiconductor device 10, source region 20 and drain region 40 are doped with p-type impurities. In particular embodiments, source region 20 and drain region 40 have a doping concentration higher than $5 \times 10^{19}$ cm$^{-3}$.

In particular embodiments, source region 20 and drain region 40 are formed by the diffusion of dopants through corresponding polysilicon regions 70$a$ and 70$c$, respectively, as discussed in further detail below with respect to FIG. 7. Consequently, in such embodiments, the boundaries and/or dimensions of source region 20 and drain region 40 may be precisely controlled. As a result, in particular embodiments, the depth of source region 20 (as indicated by arrow 42) is less than one hundred (100) nanometers (nm), and the depth of drain region 40 (as indicated by arrow 44) is also less than one hundred (100) nm. In certain embodiments, the depths of source region 20 and/or drain region 40 are between twenty (20) and fifty (50) nm. Because of the reduced size of source region 20 and drain region 40, particular embodiments of semiconductor device 10 may provide further reductions in the parasitic capacitance experienced by semiconductor device 10 during operation.

Link regions 50$a$ and 50$b$ comprise regions of substrate 12 formed by doping substrate 12 with n-type or p-type impurities, as appropriate. In particular embodiments, link regions 50$a$ and 50$b$ are doped using a different technique from that used to dope source region 20 and drain region 40. Because link regions 50$a$ and 50$b$ are of the same conductivity type as source region 20 and drain region 40, however, the boundary between source region 20 and link region 50$a$ and the boundary between drain region 40 and link region 50$b$ may be undetectable once the relevant regions have been formed. For example, in particular embodiments, source region 20 and drain region 40 are formed by diffusing dopants through polysilicon regions 70$a$ and 70$c$, respectively. Ion implantation is then used to add dopants to appropriate regions of substrate 12, thereby forming link regions 50$a$ and 50$b$. Because the dopant concentrations for these regions are similar or identical, the boundary between source region 20 and link region 50$a$ and the boundary between drain region 40 and link region 50$b$ are substantially undetectable after semiconductor device 10 has been formed.

Gate region 30 is formed by the addition of a layer of semiconductor material over channel region 60. A second type of dopant is then added to the semiconductor material of gate region 30. As a result, gate region 30 has a second conductivity type. Thus, for an n-type channel semiconductor device 10, gate region 30 is doped with p-type impurities. For a p-type semiconductor device 10, gate region 30 is doped with n-type impurities. In particular embodiments, gate region 30 is doped with the second type of dopant to a concentration higher than $3 \times 10^{19}$ cm$^{-3}$. As described further below, when a voltage is applied to gate region 30, the applied voltage alters the conductivity of the neighboring channel region 60, thereby facilitating or impeding the flow of current between source region 20 and drain region 40. Although FIGS. 1A and 1B illustrate an embodiment of semiconductor device 10 that includes only a single gate region 30, alternative embodiments may include multiple gate regions 30.

As noted above, semiconductor device 10, in contrast to a MOSFET, does not include an insulating layer (such as silicon dioxide) covering the area in which gate region 30 is to be formed. As a result, gate region 30 may, in particular embodiments, be formed by the diffusion of dopants through a corresponding polysilicon region 70$b$, as discussed in further detail below with respect to FIG. 7. Consequently, in such embodiments, the boundaries and/or dimensions of gate region 30 may be precisely controlled. As a result, in particular embodiments, the depth of gate region 30 (as shown by arrow 52) may be limited to less than fifty (50) nm. In certain embodiments, the depth of gate region 30 may be between ten (10) and twenty (20) nm.

Additionally, as a result of gate region 30 being formed by the diffusion of dopants through polysilicon region 70b, gate region 30 may be precisely aligned with polysilicon region 70b. More specifically, one or more boundaries of gate region 30 may be substantially aligned with one or more surfaces of the polysilicon region 70b. For example, in particular embodiments, a first boundary 32a of gate region 30 may be aligned with a first boundary 72a of polysilicon region 70b to within ten (10) nm, while a second boundary 32b of gate region 30 may be aligned with a second boundary 72b of polysilicon region 70b to within ten (10) nm. By limiting the amount of gate region 30 that extends beyond the surfaces 72 of polysilicon region 70b, particular embodiments of semiconductor device 10 may provide further reductions in the parasitic capacitance experienced by semiconductor device 10 during operation.

Furthermore, the absence of an insulating layer (as would be present in a MOSFET or similar semiconductor device) allows the semiconductor material of gate region 30 to be applied directly to channel region 60. Thus, although the description below focuses on embodiments of semiconductor device 10 in which strain is induced in channel region 60 by a substrate layer 14 abutting channel region 60, strain may alternatively or additionally be induced in channel region 60 by a layer of semiconductor material (not shown) in gate region 30 abutting channel region 60 in a similar manner to that which substrate layer 14f induces strain in channel region 60.

Channel region 60 comprises a distinct region formed in substrate 12 that abuts gate region 30 and portions of substrate 12 (including one or more substrate layers 14). Channel region 60 provides a path to conduct current between source region 20 and drain region 40 through link regions 50a and 50b. Channel region 60 is doped by the addition of the first type of impurities to a region of substrate 12. In particular embodiments, channel region 60 is doped with n-type impurities, and electrons flow from the source region 20 to the drain region 40 to create a current when an appropriate voltage is applied to semiconductor device 10. In alternative embodiments, channel region 60 is doped with p-type impurities and, when an appropriate voltage is applied to semiconductor device 10, holes flow from source region 20 to drain region 40 to create a current.

In particular embodiments, channel region 60 is doped with a substantially lower concentration of dopants than is used to dope source region 20 and drain region 40. For example, in particular embodiments, channel region 60 is doped with the first type of dopant to a concentration less than $2.0 \times 10^{19}$ cm$^{-3}$. Because of the relatively shallow depth and relatively low doping of channel region 60, semiconductor device 10 may, in particular embodiments, operate as an enhancement-mode device with a positive current flowing between drain region 40 and source region 20 when a positive voltage differential is applied between gate region 30 and source region 20.

In particular embodiments, channel region 60 may be formed by epitaxial growth of silicon or silicon alloys. As a result, the doping concentration of channel region 60 can be precisely controlled. The dimensions and/or boundaries of channel region 60 may also be precisely controlled. In other embodiments, impurities can be ion implanted in substrate 12 to form channel region 60 with an appropriate doping concentration.

Furthermore, as discussed above, channel region 60 may include a channel layer 62 composed of semiconductor material that has a different interatomic spacing than the semiconductor material in the abutting layer 14 of substrate 12. As a result of the difference between the interatomic spacing of the material in substrate layer 14f and the material in channel layer 62, substrate layer 14f may induce a strain in channel layer 62, as described above. FIG. 1B illustrates in greater detail the composition of substrate layers 14 and channel region 62 in an example embodiment of semiconductor device 10.

Polysilicon regions 70a-d comprise polysilicon structures that provide an ohmic connection between contacts 80a-d and source region 20, gate region 30, and drain region 40, respectively. In particular embodiments, polysilicon regions 70 may connect pins of an integrated circuit package to the various regions of semiconductor device 10. Furthermore, as described in greater detail below, with respect to FIG. 7, in particular embodiments, source region 20, drain region 40, and gate region 30 are formed by dopants that are diffused through polysilicon regions 70. As a result, in particular embodiments, polysilicon regions 70 may themselves comprise doped material, even after any appropriate diffusion of dopants into the various regions of substrate 12 has occurred. Additionally, in particular embodiments, polysilicon regions 70 may be coplanar. Moreover, contacts 80 may additionally or alternatively be coplanar so that particular surfaces of all contacts 80 have the same height. Coplanar polysilicon regions 70 and/or contacts 80 may simplify the manufacturing and packaging of semiconductor device 10.

In operation, channel region 60 provides a voltage-controlled conductivity path between source region 20 and drain region 40 through link regions 50. More specifically, a voltage differential between gate region 30 and source region 20 (referred to herein as $V_{GS}$) controls channel region 60 by increasing or decreasing a width of a depletion region (not shown) formed along the boundary 64 between channel region 60 and gate region 30. This depletion region defines an area within channel region 60 in which the recombination of holes and electrons has depleted semiconductor device 10 of charge carriers. Because the depletion region lacks charge carriers, the depletion region will impede the flow of current between source region 20 and drain region 40. Moreover, as the depletion region expands and recedes, the portion of channel region 60 through which current can flow grows or shrinks, respectively. As a result, the conductivity of channel region 60 increases and decreases as $V_{GS}$ changes, and semiconductor device 10 may operate as a voltage-controlled current regulator.

Furthermore, in particular embodiments, semiconductor device 10 comprises an enhancement mode device. Thus, when $V_{GS} \leq 0$, depletion region pinches off channel region 60 preventing current from flowing between source region 20 and drain region 40. When $V_{GS} > 0$, depletion region recedes to a point that a current flows between source region 20 and source 40 through link regions 50 and channel region 60 when a positive voltage differential is applied between source region 20 and drain region 40 (referred to herein as $V_{DS}$).

Overall, in particular embodiments, the dimensions of channel region 60, gate region 30, source region 20, and/or drain region 40 may reduce the parasitic capacitances created within semiconductor device 10 and may, as a result, allow semiconductor device 10 to operate with reduced drive current. As a result, one or more semiconductors can be combined onto a microchip to form a memory device, processor, or other appropriate electronic device that is capable of functioning with a reduced operational voltage. For example, in particular embodiments of semiconductor device 10, channel region 60 may conduct current between source region 20 and drain region 40 with a $V_{GS}$ of 0.5V or less. Consequently, electronic devices that include semiconductor device 10 may be capable of operating at higher speed and with lower power consumption than conventional semiconductor devices.

In addition, as noted above, the semiconductor material of substrate 12 may, in particular embodiments, apply a stress to the semiconductor material in channel region 60 along a boundary between substrate 12 and channel region 60. This stress strains the semiconductor material in channel region 60 thereby reducing the atomic forces that interfere with the movement of electrons through the semiconductor material in channel region 60. As a result, the strained semiconductor material enhances electron mobility in channel region 60 and, thus, allows semiconductor device 10 to switch states (e.g., turn on and turn off) more quickly and operate with lower power consumption.

Thus, certain embodiments of semiconductor device 10 may provide several benefits. Nonetheless, alternative embodiments may provide some, none, or all of these benefits.

FIG. 1B is a magnified view of the area of semiconductor device 10 surrounding channel region 60. As shown by FIG. 1B, substrate 12 includes a plurality of layers 14, including a layer 14f that abuts a channel layer 62 of channel region 60. In the illustrated embodiment, substrate layer 14a represents a relaxed layer of a first semiconductor material (e.g., silicon). On top of substrate layer 14a are a plurality of substrate layers 14 that have an increasing percentage of a second semiconductor material (e.g., germanium). For example, as shown in the example embodiment, the percentage of germanium in each layer increases by 5% to a maximum of 25% in substrate layer 14f.

Additionally, channel layer 62 of channel region 60 is formed on top of and abutting substrate layer 14f. In the illustrated embodiment, channel layer 62 contains little or none of the second semiconductor material (e.g., channel layer 62 may be pure silicon). As a result, a difference may exist between the amount of the second semiconductor material that is included in substrate layer 14f and the amount included in channel layer 62, leading to a different interatomic spacing between corresponding silicon atoms in substrate layer 14f and channel layer 62. This difference in interatomic spacing induces a strain in channel layer 62 as silicon atoms in channel layer 62 attempt to align with atoms in the abutting substrate layer 14f. In the illustrated embodiment, the silicon atoms in the silicon germanium of substrate layer 14f are spaced further apart than the silicon atoms in channel layer 62 and, therefore, substrate layer 12f induces a tensile strain in channel layer 62.

Although FIG. 1B illustrates an example of the structure and composition of substrate 12 and channel region 60 according to particular embodiments, semiconductor device 10 may use any appropriate combination of semiconductor materials in substrate 12 to induce the strain in channel region 60. Furthermore, because semiconductor device 10 lacks a silicon oxide layer or similar insulating layer covering gate region 30, gate region 30 may, in particular embodiments, be designed so that a layer of gate region 30 can additionally or alternatively induce a strain in channel region 60 in a similar fashion to that described with respect to substrate layers 14. As a result, in particular embodiments, channel region 60 may experience strain both from above and below.

Figure 2:
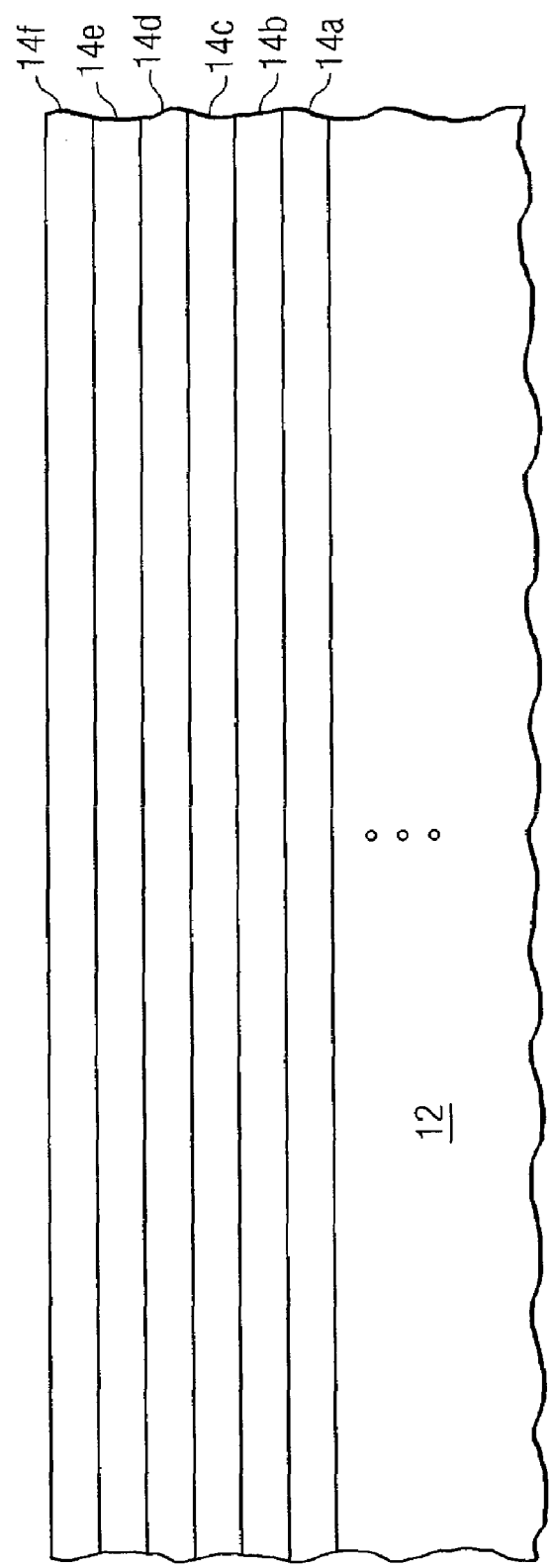
FIGS. 2-12 illustrate a method for fabricating the semiconductor device shown in FIGS. 1A and 1B.

FIG. 2 shows the fabrication of a substrate 12 for use in forming a semiconductor device 110 similar in structure and operation to the one illustrated in FIGS. 1A and 1B. In the fabrication example illustrated in FIGS. 2-14, semiconductor device 110 represents an n-type channel JFET, but semiconductor device 110 may, in general, represent any type of device appropriate for fabrication using the described techniques. Additionally, as suggested by the jagged boundary of the illustrated portion of substrate 12, semiconductor device 110 may represent one of multiple devices formed in substrate 12.

More specifically, FIG. 2 illustrates the formation of a substrate 12 having multiple layers of semiconductor material. The composition of these multiple layers may vary, as described above, so that the interatomic spacing of the semiconductor materials also varies. This series of substrate layers 14 may be formed on substrate 12 using any appropriate fabrication techniques. In particular embodiments, substrate layers 14 may be formed by epitaxial growth. For example, in particular embodiments, layers 14 may be composed of a silicon germanium alloy containing varying amounts of silicon germanium. These silicon germanium substrate layers 14 may be formed by epitaxial growth using silane ($SiH_4$) and germane ($GeH_4$) precursors with deposition conditions controlled to create an increasing amount of germanium with each successive layer.

After substrate layers 14 have been formed as shown in FIG. 2, a layer 62 of semiconductor material (such as silicon) that will ultimately form part of channel region 60 may be added on top of substrate layers 14. Layer 62 may be formed in selective locations on substrate 12, or may be formed across all of substrate 12 and selectively doped to form an appropriate channel layer 62. Additional layers are subsequently added on top of channel layer 62 to complete substrate 12. The remainder of semiconductor device 110 may then be fabricated as shown in FIGS. 3-13.

Figure 3:
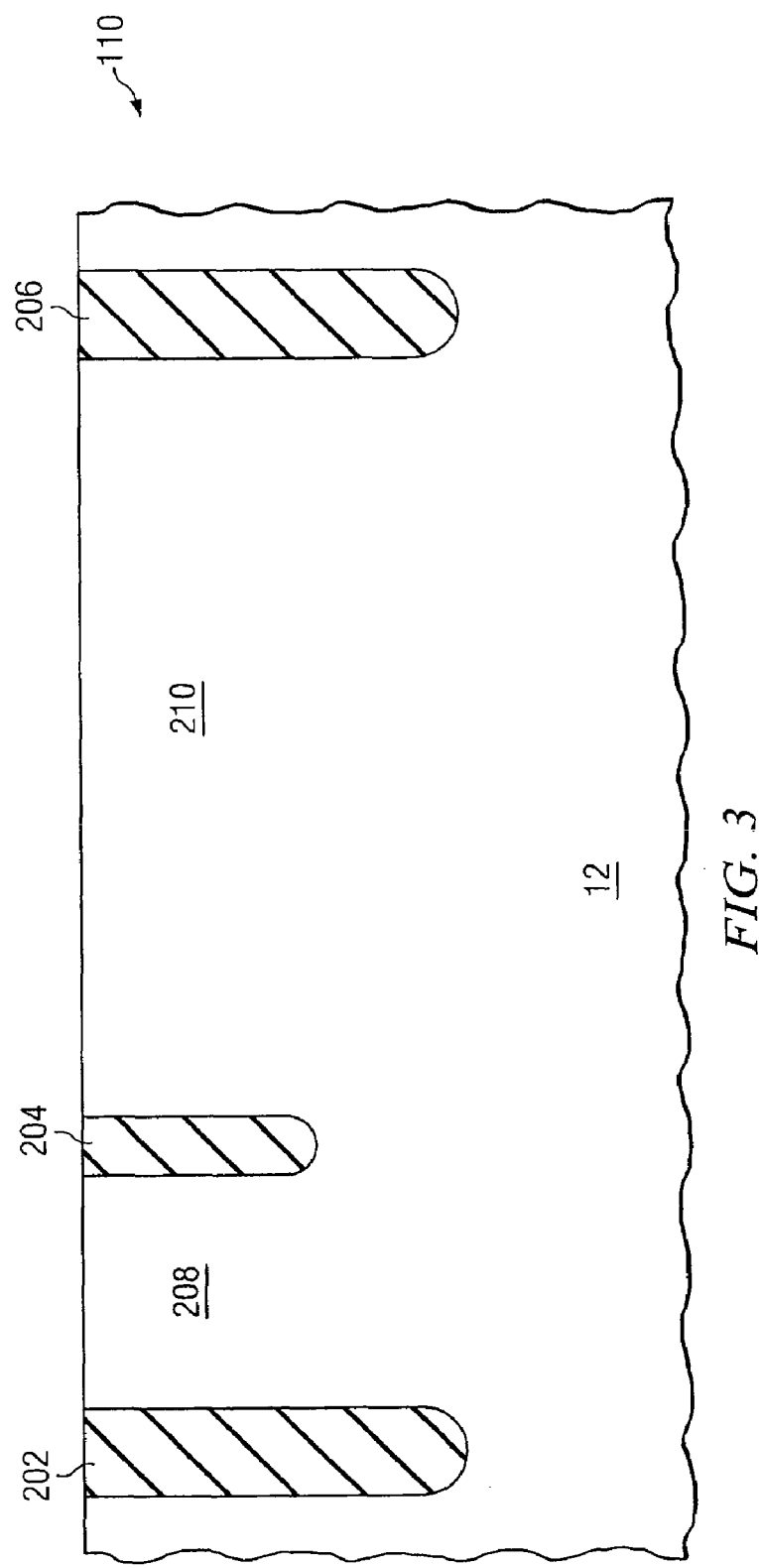

FIG. 3 shows a cross-sectional view of completed substrate 12 after certain preliminary steps in the example fabrication process have been completed to achieve the isolation of various regions where active devices will be formed. The substrate layers 14 making up substrate 12 (illustrated in FIG. 2) are not shown. Structures 202, 204, and 206 represent Shallow Trench Isolation (STI) structures that are filled with insulating material, such as silicon dioxide and/or nitride and formed to define active regions 208 and 210. Active regions 208 and 210 represent areas of substrate 12 where a semiconductor device 110, similar in structure and operation to the one illustrated in FIGS. 1A and 1B, can be formed. In the fabrication example illustrated in FIGS. 3-14, semiconductor device 110 represents an n-type channel JFET, but semiconductor device 110 may, in general, represent any type of device appropriate for fabrication using the described techniques. Additionally, as suggested by the jagged boundary of the illustrated portion of substrate 12, semiconductor device 110 may represent one of multiple devices formed in substrate 12.

Figure 4:
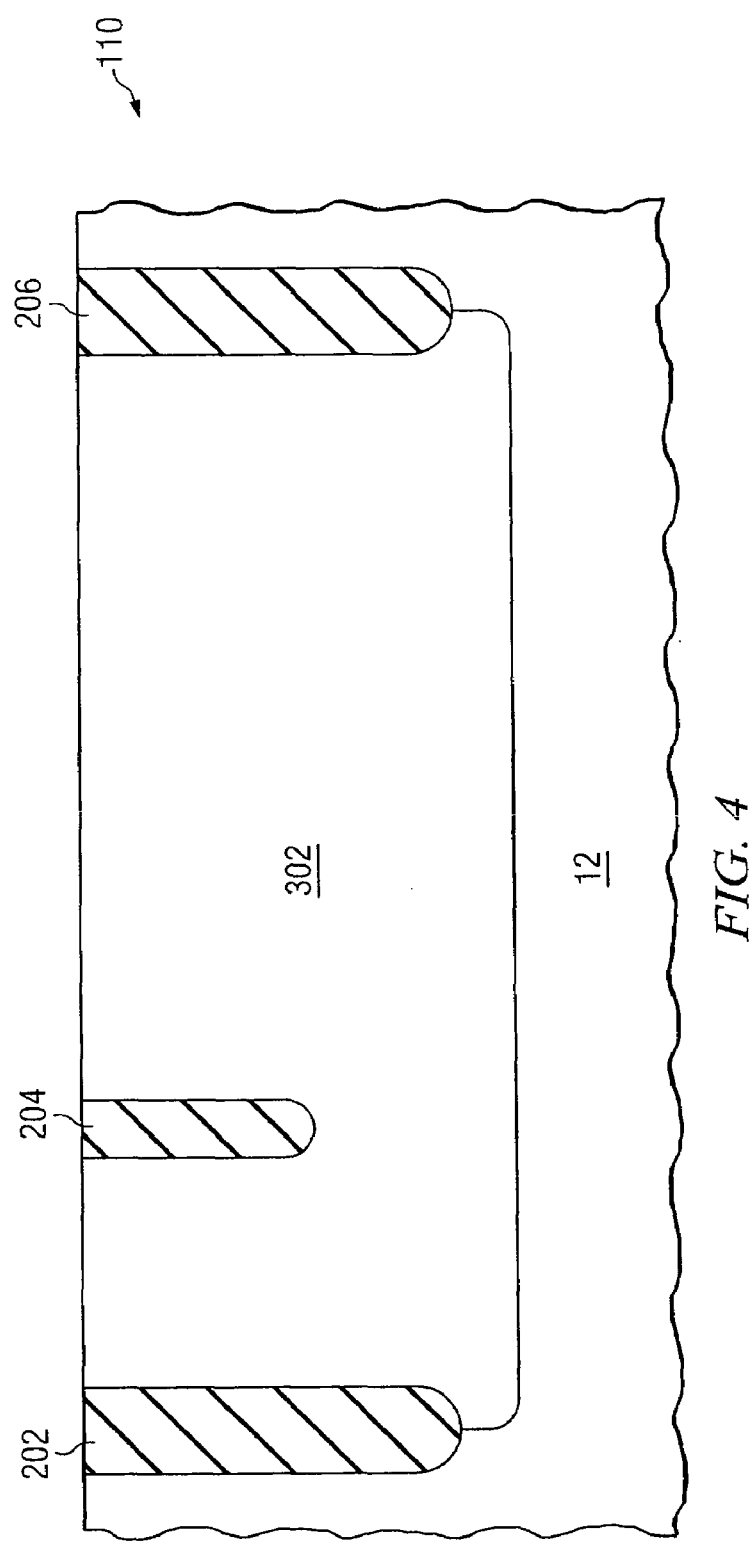

FIG. 4 shows the formation of a well region 302 by doping active region 208 and 210 with appropriate impurities. Well region 302 isolates the semiconductor device 110 to be formed from substrate 12. In the illustrated example, well region 302 represents an n-well. This n-well may be formed using any suitable fabrication technique. For example, phosphorous and/or arsenic atoms may be implanted in well region 302 to form the n-well. These impurities may be implanted to a doping concentration of $1.0\times10^{11}/cm^2$ to $1.0\times10^{14}/cm^2$ with an energy of implantation ranging from 10 KeV and 400 KeV. In particular embodiments, multiple implants may be used to achieve the desired impurity doping profile. In order to selectively implant regions with impurities, implants may be done using photoresist masks to shield any regions not designed to receive the implant. Additional implants of boron may be provided under insulating regions 202, 204, and 206 to increase the doping in the areas beneath the oxide and prevent any leakage between the adjoining wells. In alternative embodiments, the various regions of semiconductor device 110 can be formed in substrate 12 without using well regions 302 to isolate semiconductor device 110. In such embodiments, the doping steps shown in FIG. 4 may be omitted and/or other suitable modifications to the fabrication process may be made.

Figure 5:
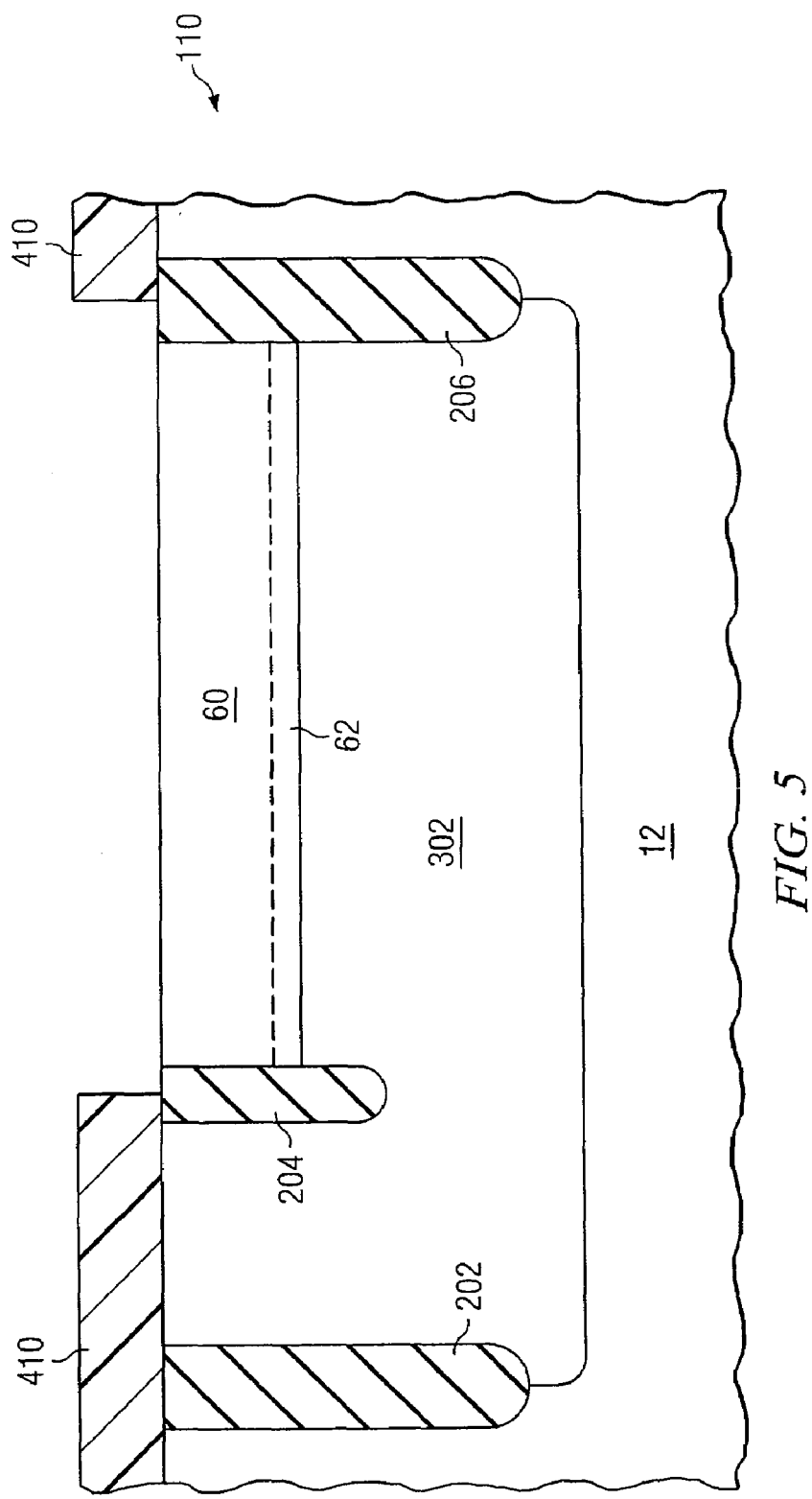
Figure 6:
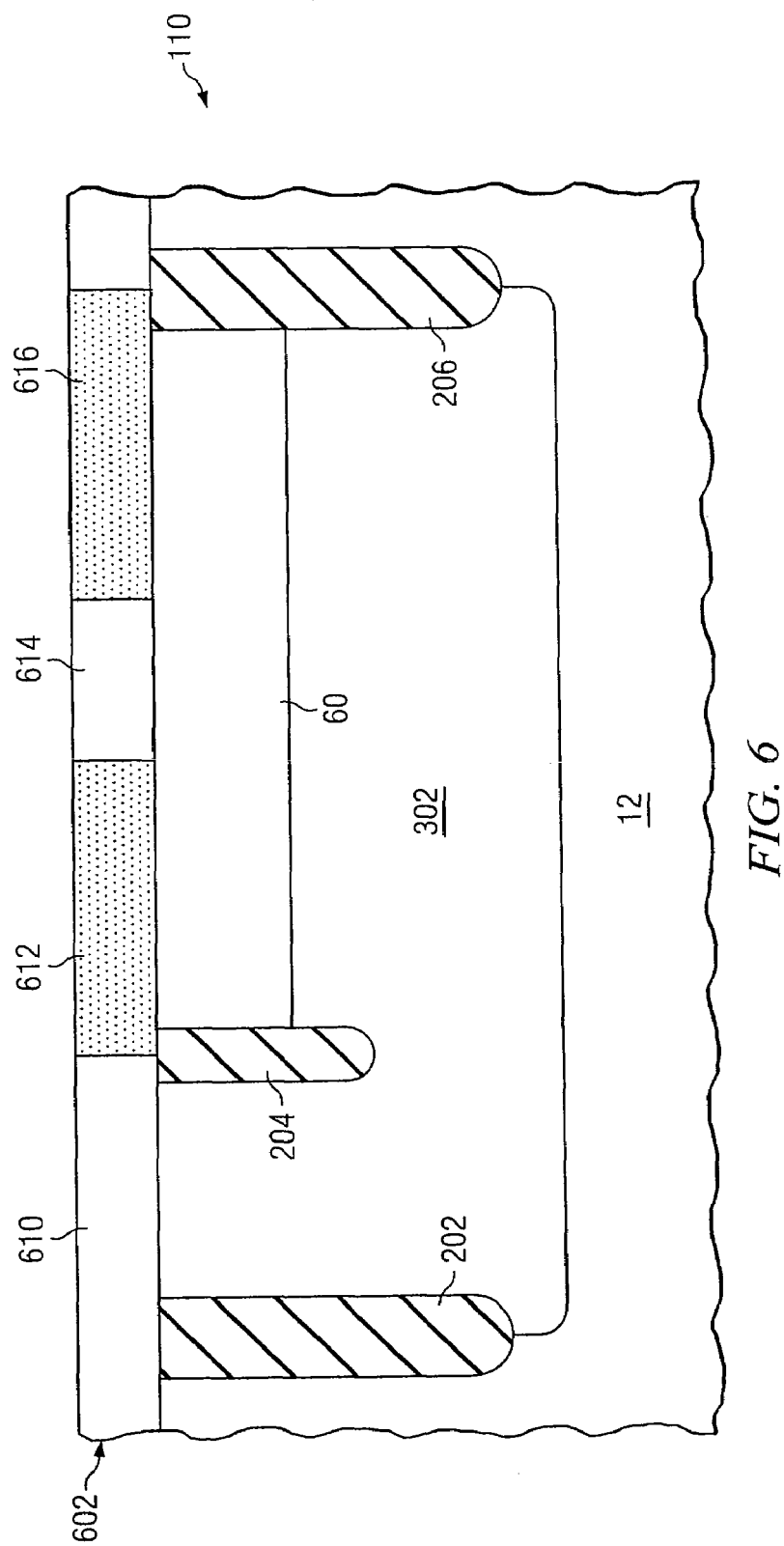

FIG. 5 shows the doping of channel region 60 in semiconductor device 110 (including channel layer 62). Channel region 60 may be doped using any fabrication techniques appropriate for semiconductor device 110. In particular embodiments, channel region 60 may be doped by selective implantation using photoresist masks. For example, for the n-type semiconductor device 110 shown in FIG. 5, channel region 60 may be doped using an n-type dopant such as arsenic, phosphorous, or antimony with photoresist 410 covering the regions where n-type implants are to be blocked. Photoresist 410 may then be removed following implantation (as shown in FIG. 6). In alternative embodiments, channel region 60 may be formed by plasma immersion doping. In yet other embodiments, channel region 60 may be formed by epitaxial growth (using, e.g., silicon). In such embodiments, channel region 60 may be doped by selective doping following growth of the relevant layers or doped during deposition by methods such as atomic layer epitaxy.

FIG. 6 illustrates the deposition of a polysilicon layer 602 over substrate 12. In particular embodiments, the thickness of polysilicon layer 602 varies between 100 Å and 10,000 Å. Using photoresist to mask appropriate portions of substrate 12, polysilicon layer 602 may be selectively doped to form the regions which will eventually become the source, drain, gate, and well contacts of semiconductor device 110. The details of the photolithographic process are omitted here for the sake of brevity.

Polysilicon region 610 is designed to act as the contact for well region 302 of semiconductor device 110. Because, in the illustrated example, semiconductor device 110 is an n-type channel device, polysilicon region 610 is doped with a heavy boron implant to a dose ranging between $1 \times 10^{13}/cm^2$ and $1 \times 10^{16}/cm^2$. Polysilicon region 614 is designed to act as the gate contact for semiconductor device 110 and, in this example, is doped heavily p-type with the parameters similar to those of polysilicon region 610. Polysilicon regions 612 and 616 are doped heavily with n-type dopants (such as phosphorous, arsenic, and antimony) to a dose ranging between $1 \times 10^{13}/cm^2$ and $1 \times 10^{16}/cm^2$ and are designed to act as the source and drain contacts of semiconductor device 110 (contacts 80a and 80b in FIG. 1A), respectively. In alternative embodiments, a layer of oxide may be deposited on top of polysilicon layer 602 before ion implantation is performed. The thickness of this oxide layer may vary between 20 Å and 500 Å. In other embodiments, layers of oxide and/or nitride may be deposited on top of polysilicon layer 602 prior to ion implantation, with the thickness of the oxide and nitride films varying between 10 Å and 500 Å each.

Figure 7:
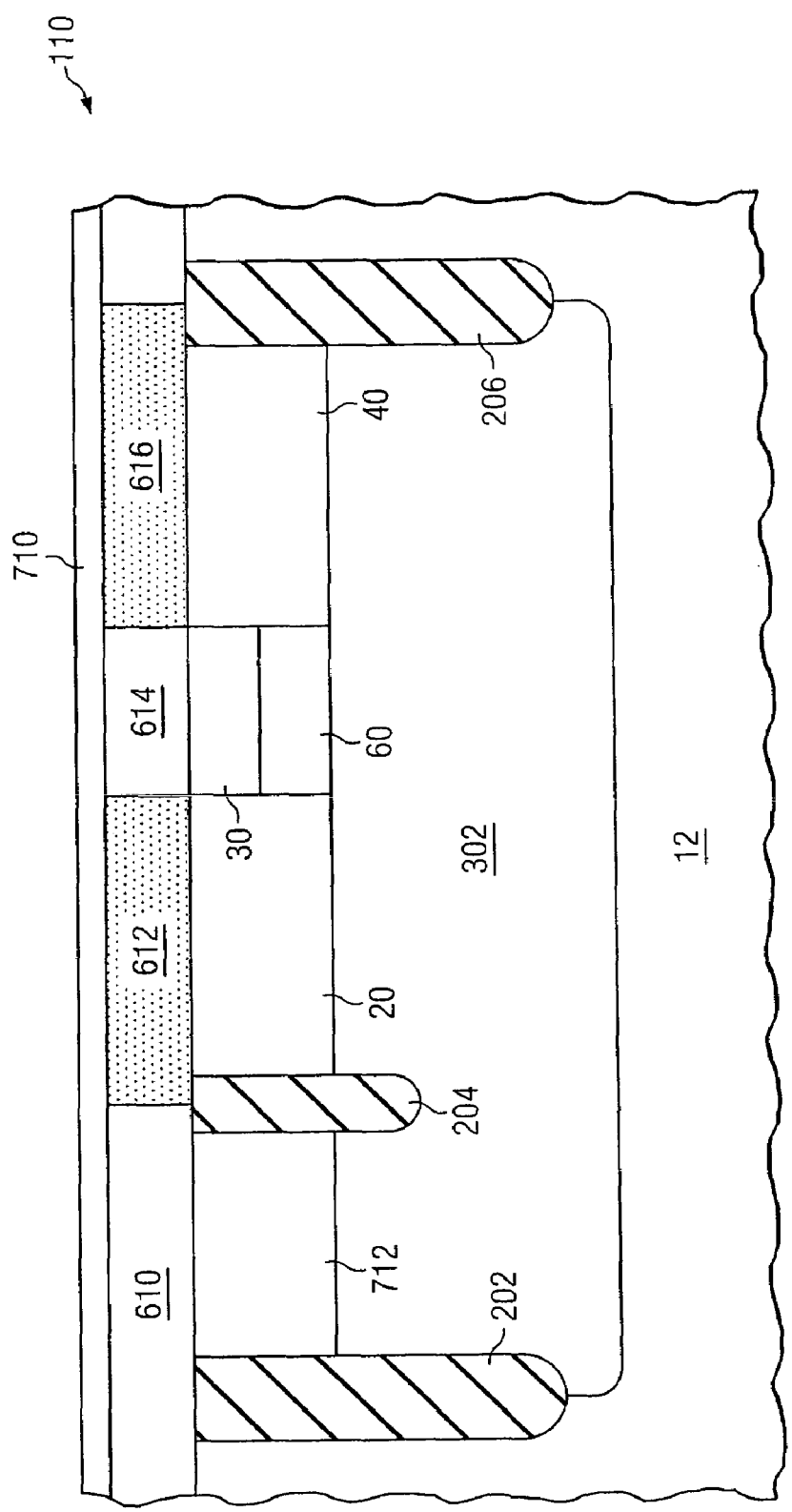

FIG. 7 shows a cross-sectional view of substrate 12 with polysilicon layer 602 doped with impurities and a protective layer 710 on top of polysilicon layer 602. The impurities implanted in various regions of polysilicon layer 602 (e.g., during the example steps shown in FIG. 6) are used as a source of dopants for indirect diffusion into substrate 12 to form source region 20 and drain region 40 of semiconductor device 110. In particular, source region 20 and drain region 40 contain n-type impurities diffused from polysilicon regions 612 and 616, respectively. Gate region 30 may also be doped by the diffusion of p-type impurities from polysilicon region 614. Additionally, a well tap 712 may be doped by diffusion of p-type impurities from polysilicon region 610, and subsequently polysilicon region 610 may form an ohmic contact to well tap 712. In alternative embodiments, multiple ion implants, varying the implant dose and energy and the implanted dopant type, are made into polysilicon regions 610, 612, 614, and 616 to form well tap 712, source region 20, gate region 30, and drain region 40.

Figure 8:
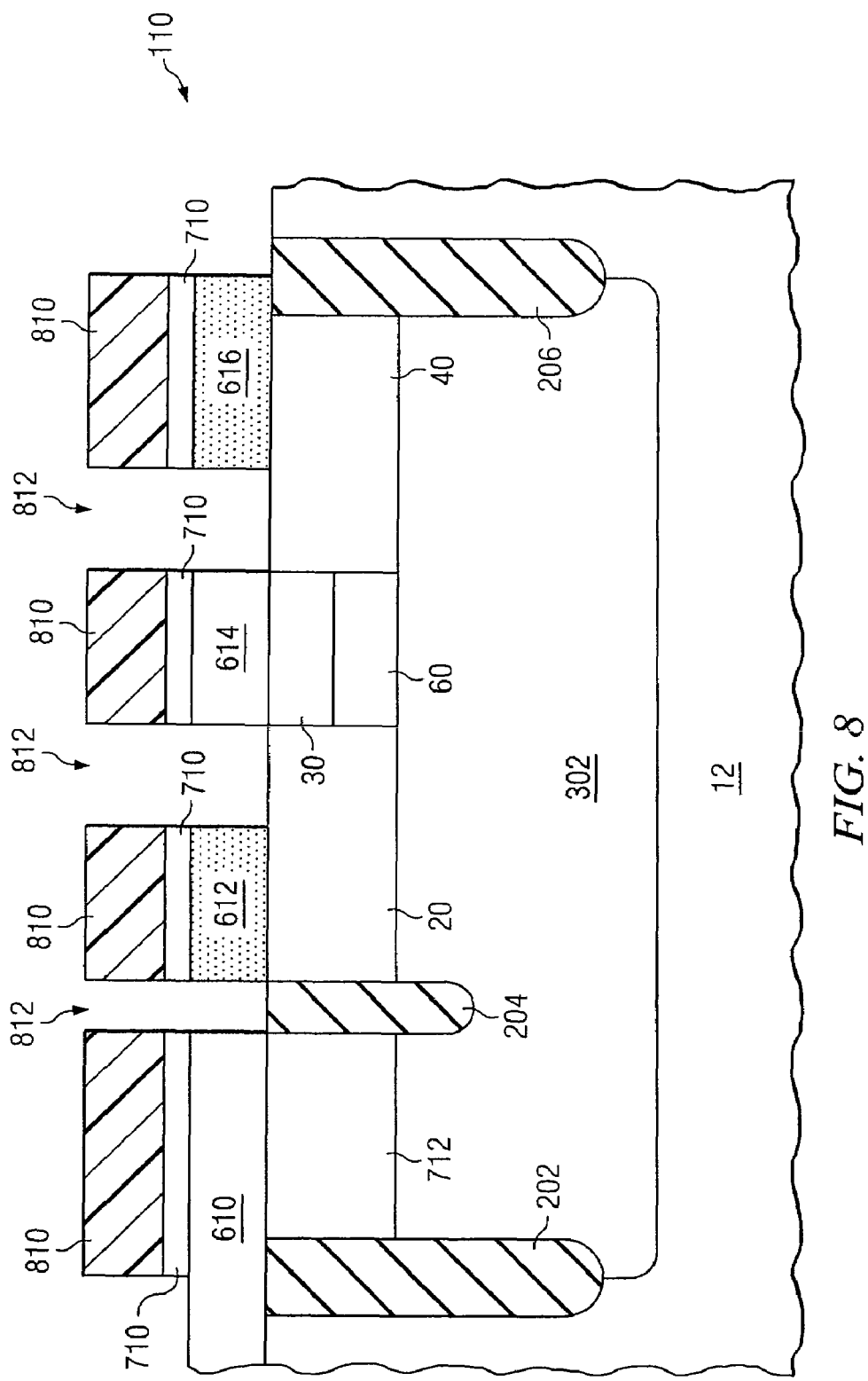

FIG. 8 illustrates a contact patterning process that is performed, in particular embodiments, after the diffusion of dopants into the various regions of substrate 12 (or the completion of alternative doping steps). Using an optical lithographic process, a layer of an anti-reflective coating may (if appropriate) be coated on a protective layer, followed by a layer of photoresist. The thickness of these layers depends upon the selection of the photoresist, as is known to those skilled in the art. The photoresist layer is exposed and various terminals are delineated in the photoresist, marked as 810 in FIG. 8. Alternate embodiments of this invention includes other methods of patterning the photoresist, including imprint lithography and e-beam lithography. With the photoresist layer as the mask, the protective layer above the polysilicon is etched first. Next, the polysilicon layer is etched, with one or more grooves 812 reaching the bottom of the polysilicon layer. This step isolates the various terminals electrically. For patterning the photoresist, various processes such as optical lithography, immersion lithography, imprint lithography, direct write e-beam lithography, x-ray lithography, or extreme ultraviolet lithography are used.

Figure 9:
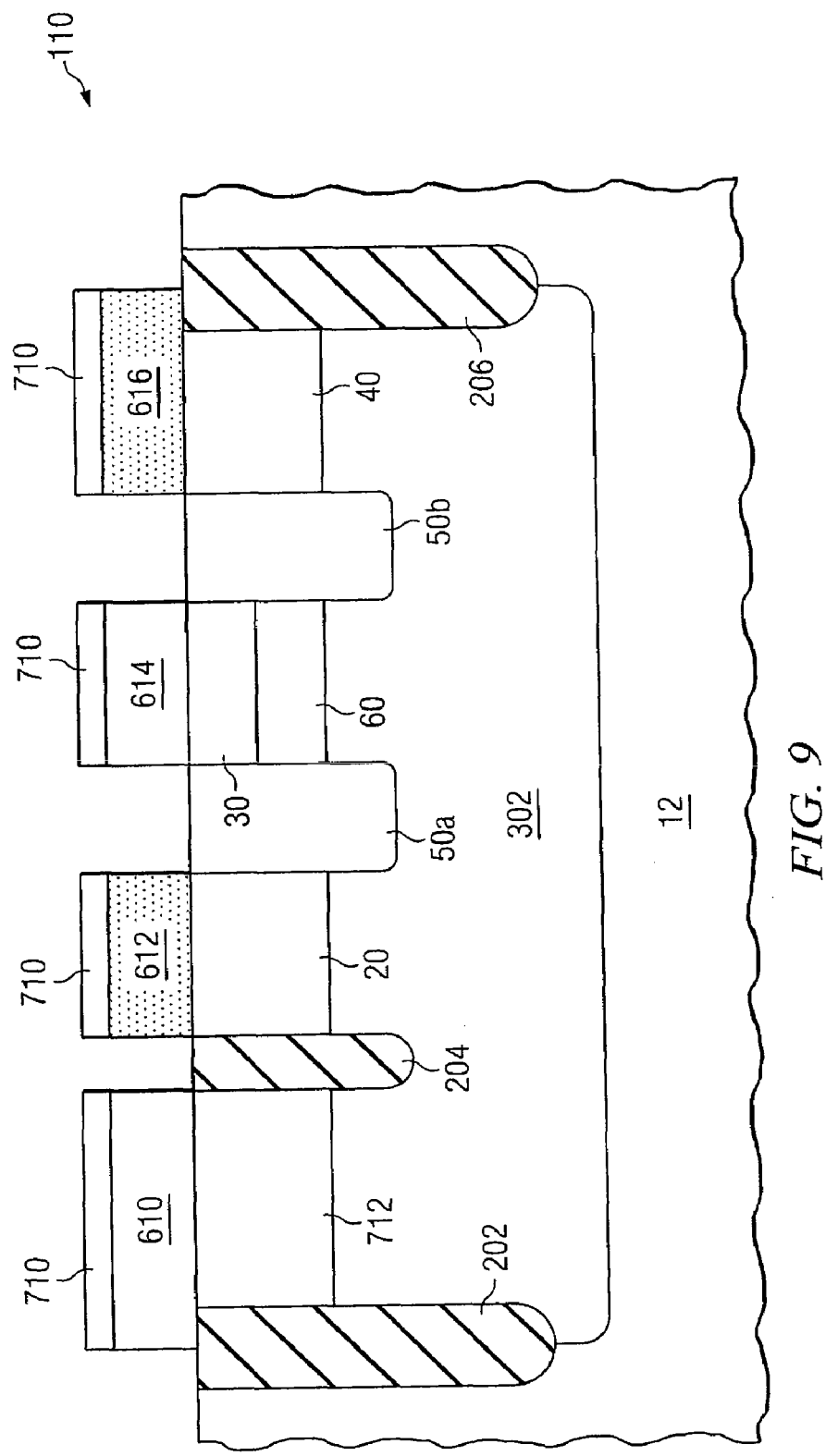

FIG. 9 shows a cross-sectional view of substrate 12 after the areas between channel region 60 and source region 20 and between channel region 60 and drain region 40 have been doped. More specifically, after etching polysilicon layer 602, the area between source region 20 and channel region 60 and the area between drain region 40 and channel region 60 are doped to form a low resistivity path between source region 20 and channel region 60 (referred to here as link region 50a) and between drain region 40 and channel region 60 (referred to here as link region 50b). In the illustrated example, link regions 50a and 50b are formed by the addition of n-type impurities to these regions using a suitable doping process including, but not limited to, ion implantation or plasma immersion implantation. After ion implantation, the dopants are activated by a rapid thermal annealing process. An oxidation step, performed at temperatures ranging between 700 C and 950 C, may be used to oxidize any regions of silicon that may be damaged during etching. In particular embodiments, link regions 50a and 50b may be formed to a junction depth independent from that of the neighboring source region 20 and drain region 40.

Figure 10:
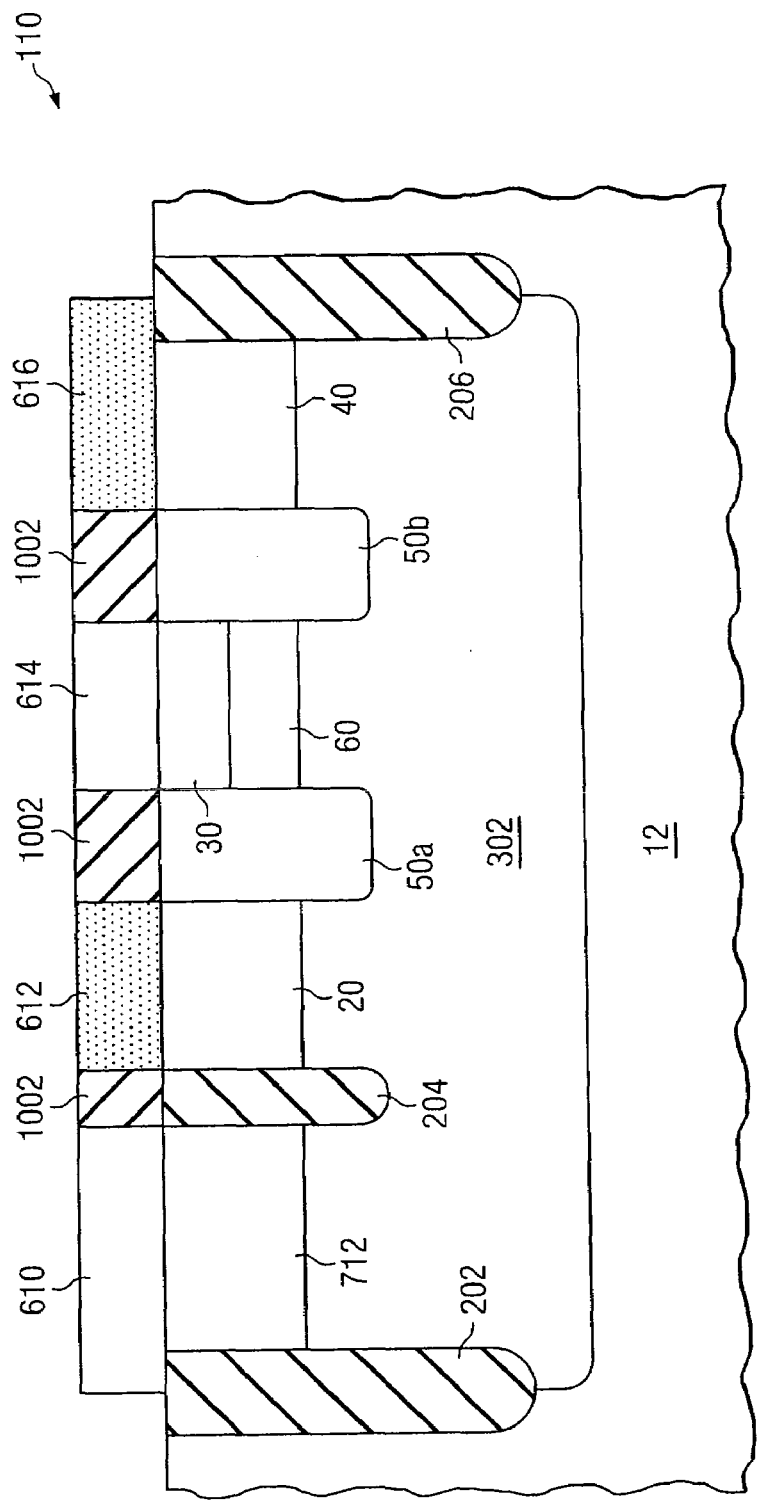

FIG. 10 shows a cross-sectional view of substrate 12 after the gaps between polysilicon regions 610, 612, 614, and 616 are filled with an insulating material 1002, such as silicon dioxide, and then processed (e.g., using a method such as chemical-mechanical-polishing) to provide a nearly planar surface at the same level as polysilicon layer 602. The technique of filling insulating material 1002 in the gaps between the polysilicon regions 610, 612, 614, and 616 by depositing silicon dioxide using chemical vapor deposition or plasma assisted chemical vapor deposition is one which is widely used in semiconductor manufacturing. One such process employs the deposition of oxide by a low temperature plasma-activated reaction between silane and oxygen in gaseous form.

Figure 11:
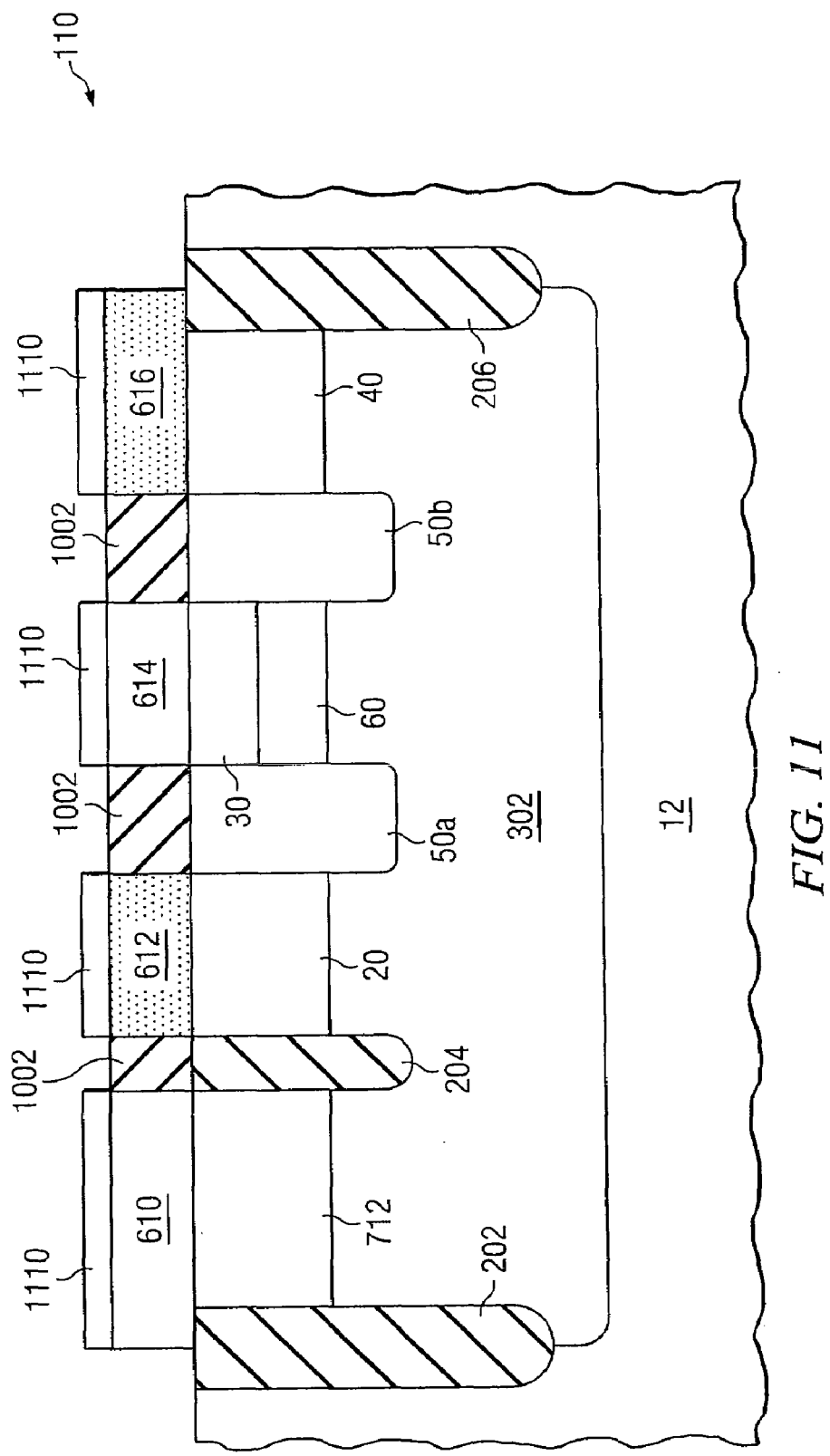

FIG. 11 shows a cross-section view of substrate 12 after formation of self-aligned silicide on the exposed polysilicon surfaces. A layer of a metal (not shown) such as nickel, cobalt, titanium, platinum, palladium, or other refractory metal is deposited on the polysilicon surface and annealed such that the exposed regions of polysilicon form a binary compound with the metal layer known as a "metal silicide." Such metal silicides are highly conductive substances. The preferred thickness of the deposited metal is between 50 Å and 1000 Å on an atomically clean surface of polysilicon. The wafers are heated in a rapid anneal furnace at temperatures between 200 C and 800 C for a time period between 10 seconds and 30 minutes to form silicides selectively where metal is in contact with a silicon or polysilicon layer. In particular embodiments, after the reaction between the metal layer and silicon has taken place, the excess metal is removed from the wafer by a chemical etching process which does not affect the silicide layer. Unreacted metal may be selectively etched off using appropriate solvents, leaving only a metal silicide layer 1110 over the exposed polysilicon regions 610, 612, 614, and 616. For titanium and cobalt, a mixture of hydrogen peroxide and ammonium hydroxide may be used in a ratio of 1:0.1 to 1:10 as appropriate at room temperature, although temperatures above room temperatures can also be used. Consequently, in particular embodiments, a self aligned silicide layer 1110 is formed on polysilicon regions 610, 612, 614, and 616 as shown in FIG. 11. Additionally, polysilicon regions 610, 612, 614, and 616 may be used as local interconnects and, thus, this silicided polysilicon may be used for making ohmic contact.

Figure 12:
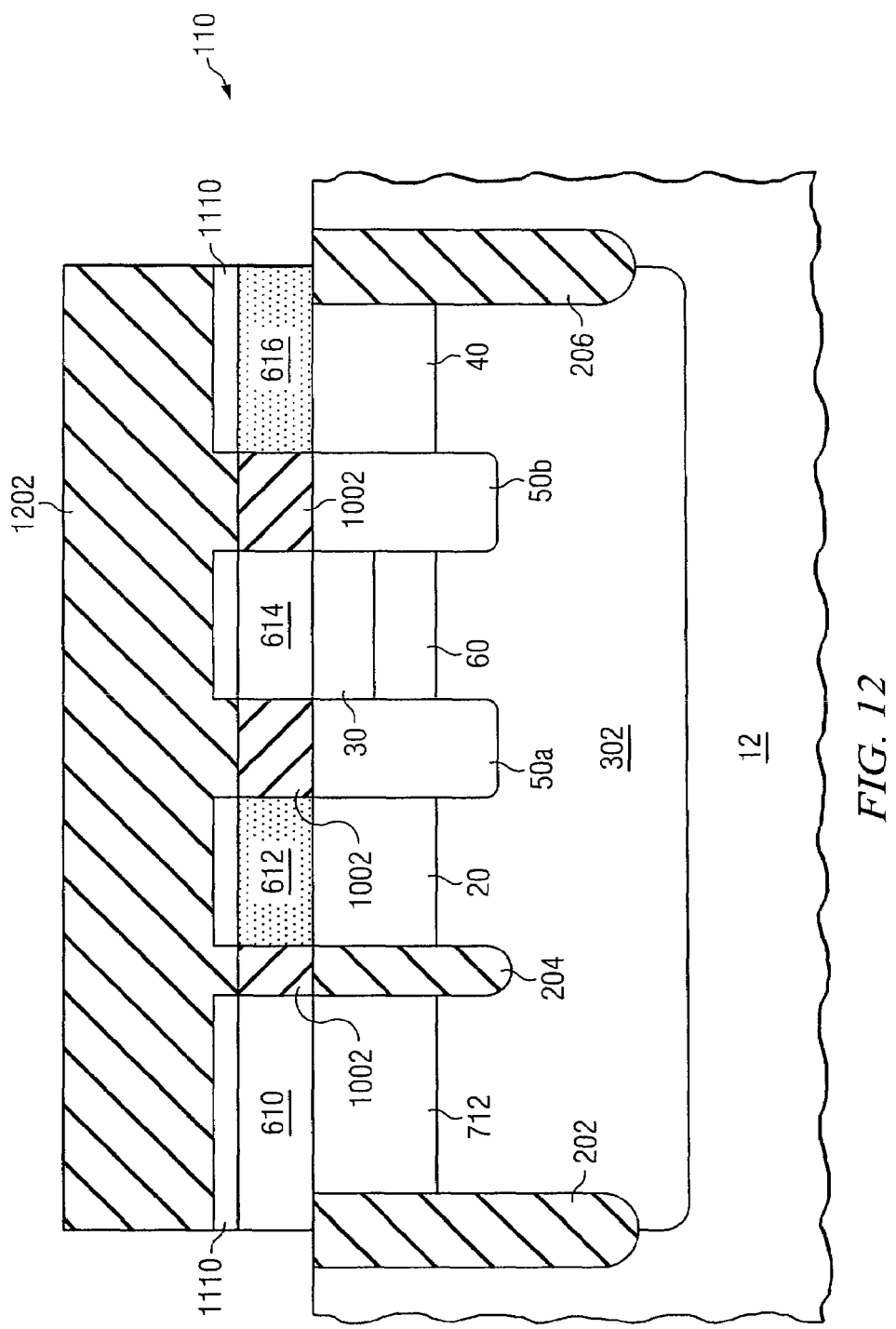

Subsequent fabrication steps may consist of depositing a dielectric (oxide) layer 1202, etching contact holes in dielectric layer 1202, forming contact holes for the source, drain, gate and well tap terminals, and continuing with conventional metal interconnect formation process. A cross-sectional view of substrate 12 after deposition of dielectric layer 1202 and contact hole etch have been performed is shown in FIG. 12. Metal deposition and etch (not shown) may then be performed.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A semiconductor device, comprising:
   a semiconductor substrate comprising a substrate layer having a first composition of semiconductor material;
   a source region formed in the substrate;
   a drain region formed in the substrate and spaced apart from the source region;
   a gate region formed in the substrate abutting the channel region; and
   a channel region formed in the substrate and abutting the gate region, wherein the channel region comprises a channel layer having a second composition of semiconductor material, wherein the substrate layer abuts the channel layer and applies a first stress to the channel region along a boundary between the substrate layer and the channel layer, the gate region comprises a gate layer that applies a second stress to a second surface of the channel region along a boundary between the channel region and the gate region, and wherein the semiconductor device comprises a junction field effect (JFET) transistor.

2. The semiconductor device of claim 1, wherein:
   the substrate layer comprises semiconductor material having a first lattice constant;
   the channel layer comprises semiconductor material having a second lattice constant; and
   the first lattice constant is greater than the second lattice constant.

3. The semiconductor device of claim 2, wherein the substrate layer applies a tensile stress to the channel region.

4. The semiconductor device of claim 1, wherein the substrate comprises a plurality of substrate layers, each substrate layer comprising an alloy of a first semiconductor material and a second semiconductor material, wherein the plurality of substrate layers are formed upon one another with successive layers having increasing percentages of the second semiconductor material.

5. The semiconductor device of claim 4, wherein the first semiconductor material comprises silicon and the second semiconductor material comprises silicon germanium.

6. The semiconductor device of claim 1, wherein the channel layer comprises the first semiconductor material, and wherein the second semiconductor material has a greater lattice constant than the first semiconductor material.

7. The semiconductor device of claim 1, wherein the gate region comprises semiconductor material doped with impurities of a first polarity, and the channel region comprises semiconductor material doped with impurities of a second polarity.

8. The semiconductor device of claim 1, further comprising a gate electrode region which overlays the semiconductor substrate, and a gate contact formed on the gate electrode region and in ohmic contact with the gate region.

9. A semiconductor device, comprising:
   a semiconductor substrate comprising a substrate layer having a first composition of semiconductor material;
   a source region formed in the substrate;
   a drain region formed in the substrate and spaced apart from the source region;
   a gate region formed in the substrate abutting the channel region; and
   a channel region formed in the substrate and abutting the gate region;
   wherein:
   the semiconductor device comprises a junction field effect (JFET) transistor;
   the channel region comprises a channel layer having a second composition of semiconductor material;
   the substrate layer abuts the channel layer and applies a tensile stress to the channel region along a boundary between the substrate layer and the channel layer.

10. The semiconductor device of claim 9, wherein:
    the substrate layer comprises semiconductor material having a first lattice constant;
    the channel layer comprises semiconductor material having a second lattice constant; and
    the first lattice constant is greater than the second lattice constant.

11. The semiconductor device of claim 9, wherein the substrate comprises a plurality of substrate layers, each substrate layer comprising an alloy of a first semiconductor material and a second semiconductor material, wherein the plurality of substrate layers are formed upon one another with successive layers having increasing percentages of the second semiconductor material.

12. The semiconductor device of claim 11, wherein the first semiconductor material comprises silicon and the second semiconductor material comprises silicon germanium.

13. The semiconductor device of claim 9, wherein the gate region comprises semiconductor material doped with impurities of a first polarity, and the channel region comprises semiconductor material doped with impurities of a second polarity.

14. The semiconductor device of claim 9, further comprising a gate electrode region which overlays the semiconductor substrate, and a gate contact formed on the gate electrode region and in ohmic contact with the gate region.

* * * * *